(12) United States Patent
Chen et al.

(10) Patent No.: US 11,430,825 B2
(45) Date of Patent: Aug. 30, 2022

(54) IMAGE CAPTURING ASSEMBLY, LENS MODULE AND ELECTRONIC DEVICE

(71) Applicant: Ningbo Semiconductor International Corporation, Ningbo (CN)

(72) Inventors: Da Chen, Ningbo (CN); Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 17/096,287

(22) Filed: Nov. 12, 2020

(65) Prior Publication Data

US 2021/0066381 A1    Mar. 4, 2021

Related U.S. Application Data

(60) Division of application No. 16/236,770, filed on Dec. 31, 2018, now Pat. No. 10,861,895, which is a (Continued)

(30) Foreign Application Priority Data

Nov. 20, 2018   (CN) .......................... 201811385671.9

(51) Int. Cl.
    *H01L 27/146*    (2006.01)
(52) U.S. Cl.
    CPC .... *H01L 27/14636* (2013.01); *H01L 27/1469* (2013.01); *H01L 27/14618* (2013.01);
    (Continued)
(58) Field of Classification Search
    None
    See application file for complete search history.

(56) References Cited

U.S. PATENT DOCUMENTS

2005/0242408 A1* 11/2005 Yang ................. H01L 27/14632
                                                              257/428
2008/0274579 A1* 11/2008 Yang ................... H01L 31/0203
                                                              438/64
(Continued)

FOREIGN PATENT DOCUMENTS

CN     103700634 A     4/2014
CN     104576674 A     4/2015
       (Continued)

*Primary Examiner* — Alexander G Ghyka
(74) *Attorney, Agent, or Firm* — Anova Law Group, PLLC

(57) ABSTRACT

An image capturing assembly includes an encapsulation layer, embedded with functional components. The top surface and bottom surface of the encapsulation layer expose the functional components. A through hole is formed in the encapsulation layer; and the functional components have soldering pads facing away from a bottom of the encapsulation layer. A photosensitive unit including a photosensitive chip and an optical filter is mounted on the photosensitive chip. The photosensitive chip is embedded in the through hole; the optical filter is outside the through hole; the top surface and bottom surface of the encapsulation layer expose the photosensitive chip; and the photosensitive chip includes soldering pads facing away from the bottom of the encapsulation layer. A redistribution layer structure is on the top side of the encapsulation layer and electrically connects the soldering pads of the photosensitive chip with the soldering pads of the functional components.

6 Claims, 7 Drawing Sheets

Related U.S. Application Data continuation of application No. PCT/CN2018/119985, filed on Dec. 10, 2018.

(52) U.S. Cl.
CPC .. *H01L 27/14621* (2013.01); *H01L 27/14634* (2013.01); *H01L 27/14685* (2013.01)

(56) References Cited

U.S. PATENT DOCUMENTS

| | | | |
|---|---|---|---|
| 2013/0320471 A1* | 12/2013 | Luan | H01L 27/14618 257/432 |
| 2015/0340399 A1 | 11/2015 | Kim et al. | |
| 2018/0083061 A1 | 3/2018 | Kim et al. | |
| 2018/0090530 A1 | 3/2018 | Jeong et al. | |
| 2018/0261743 A1 | 9/2018 | Ke et al. | |
| 2019/0305023 A1 | 10/2019 | Wu | |
| 2019/0363121 A1 | 11/2019 | Chiu | |
| 2020/0161289 A1 | 5/2020 | Chen et al. | |
| 2020/0161346 A1 | 5/2020 | Chen et al. | |
| 2020/0161350 A1 | 5/2020 | Chen et al. | |
| 2020/0161356 A1 | 5/2020 | Chen et al. | |

FOREIGN PATENT DOCUMENTS

| | | | |
|---|---|---|---|
| CN | 105097862 | A | 11/2015 |
| CN | 105428378 | A | 3/2016 |
| CN | 107845653 | A | 3/2018 |
| JP | 2006147921 | A | 6/2006 |
| JP | 2008042899 | A | 2/2008 |
| KR | 20080008255 | A | 1/2008 |
| KR | 20110000952 | A | 1/2011 |
| KR | 20180032914 | A | 4/2018 |
| TW | 360868 | B | 6/1999 |

* cited by examiner

IMAGE CAPTURING ASSEMBLY, LENS MODULE AND ELECTRONIC DEVICE

CROSS-REFERENCES TO RELATED APPLICATIONS

This application is a divisional of U.S. patent application Ser. No. 16/236,770, filed on Dec. 31, 2018, which is a continuation application of PCT Patent Application No. PCT/CN2018/119985, filed on Dec. 10, 2018, which claims priority to Chinese patent application No. 201811385671.9, filed on Nov. 20, 2018, the entirety of all of which is incorporated herein by reference.

FIELD OF THE DISCLOSURE

The present disclosure generally relates to the field of lens module and more particularly, relates to an image capturing assembly, a lens module and an electronic device.

BACKGROUND

With continuous improvements of people's living standards, people have more free time to enjoy their leisure life. Photography has become a common way for people to record their travel and various daily life. Therefore, electronic devices with image capturing functions (e.g., mobile phones, tablets and cameras) are widely used in people's daily life and work and are gradually become indispensable tools for people nowadays.

Electronic devices with image capturing functions are often configured with lens modules. The design level of lens modules plays an important role for determining the image capturing quality. The lens module often includes an image capturing assembly with photosensitive chips and a lens assembly mounted on the image capturing assembly which is used to capture images of photographed objects.

In addition, to improve the imaging capability of lens modules, photosensitive chips with large imaging areas are required, and the lens modules are generally equipped with passive components such as resistors and capacitors, and peripheral chips.

BRIEF SUMMARY OF THE DISCLOSURE

One aspect of the present disclosure provides a packaging method for an image capturing assembly. The method includes: providing a photosensitive chip, where the photosensitive chip has soldering pads; mounting an optical filter on the photosensitive chip; providing a first carrier substrate and bonding functional components on the first carrier substrate temporarily, where the functional components have soldering pads facing away from the first carrier substrate or facing toward the first carrier substrate; forming an encapsulation layer on the first carrier substrate, where the encapsulation layer is at least filled between the functional components, and a through hole is formed in the encapsulation layer; placing the photosensitive chip in the through hole and bonding the photosensitive chip on the first carrier substrate temporarily, where the soldering pads of the photosensitive chip face away from the first carrier substrate; and after the photosensitive chip is temporarily bonded on the first carrier substrate, forming a redistribution layer structure to electrically connect the soldering pads of the photosensitive chip with the soldering pads of the functional components.

Another aspect of the present disclosure provides an image capturing assembly. The image capturing assembly includes: an encapsulation layer, embedded with functional components, where the encapsulation layer includes the opposing top surface and bottom surface; the top surface and bottom surface of the encapsulation layer expose the functional components; a through hole is formed in the encapsulation layer; and the functional components have soldering pads facing away from a bottom of the encapsulation layer; a photosensitive unit including a photosensitive chip and an optical filter mounted on the photosensitive chip, where the photosensitive chip is embedded in the through hole; the optical filter is outside the through hole; the top surface and bottom surface of the encapsulation layer expose the photosensitive chip; and the photosensitive chip have soldering pads facing away from the bottom of the encapsulation layer; and a redistribution layer structure, which is on the top side of the encapsulation layer and electrically connects the soldering pads of the photosensitive chip with the soldering pads of the functional components.

Another aspect of the present disclosure provides a lens module. The lens module includes: an image capturing assembly according to embodiments of the present disclosure; and a lens assembly including a holder, where the holder is mounted on the top surface of the encapsulation layer and surrounds the photosensitive unit and the functional components, and the lens assembly electrically connects the photosensitive chip with the functional components.

Another aspect of the present disclosure provides an electronic device. The electronic device includes the disclosed lens module.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
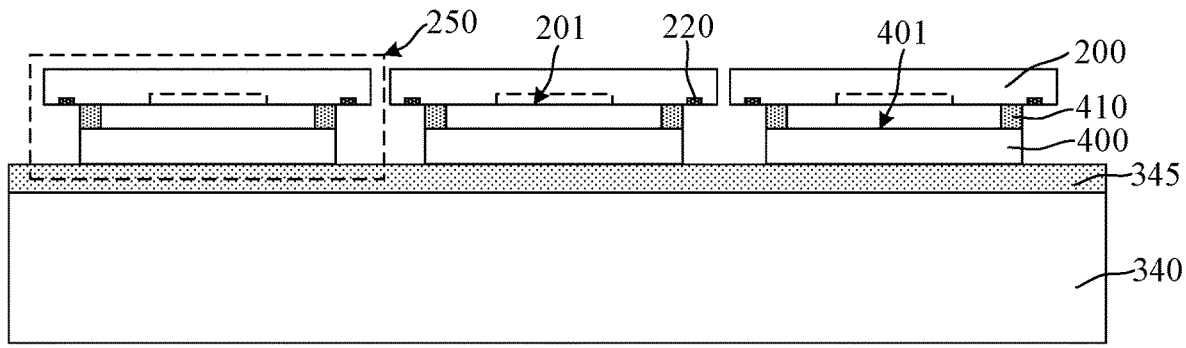
FIGS. 1-13 illustrate structural schematics corresponding to structures at certain stages of an exemplary image capturing assembly packaging method according to various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

Currently, the performance of lens modules needs to be improved and lens modules are difficult to meet miniaturization and ultra-thin thickness requirements.

A lens module may be formed including a circuit board, a photosensitive chip, functional components (e.g., peripheral chips) and a lens assembly. The peripheral chip may be mounted on a peripheral motherboard. The photosensitive chip and the functional components may be separated from each other, where the circuit board may be used to support the photosensitive chip, functional components and the lens assembly, and also the electrical connections between the photosensitive chip, functional components and the lens module may be implemented by the circuit board.

However, with the requirements of high-pixel and ultra-thin lens modules, the imaging requirements of the lens modules may be higher, the area of the photosensitive chip may be increased correspondingly, and the functional components may be also increased correspondingly, so it may result in increasingly large sizes of the lens modules, which may be difficult to meet the requirements of miniaturization and ultra-thin thickness of the lens modules.

In addition, the photosensitive chip may be positioned inside a holder of the lens module and the peripheral chip may be positioned outside the holder, so there may be a certain distance between the photosensitive chip and the peripheral chip, which may reduce the rate of signal transmission. However, the peripheral chip may usually include a digital signal processor (DSP) chip and a memory chip, so it may be easy to adversely affect the image capturing speed and the storage speed, which may degrade the operational performance of the lens modules.

In order to solve above-mentioned technical problem, the present disclosure provides a method including: integrating photosensitive chips and functional components into an encapsulation layer and electrical connections through a redistribution layer (RDL) structure, where, compared with the method of mounting the peripheral chip on the peripheral motherboard, the present disclosure may reduce a distance between a photosensitive chip and a functional component and reduce a distance of an electrical connection between a photosensitive chip and a functional component correspondingly, and further improve the rate of signal transmission and the performance of the lens modules (e.g., improve image capturing speed and storage speed); moreover, assembling photosensitive chips in through holes in the encapsulation layer after the photosensitive chips are formed the encapsulation layer, which may avoid cracking of optical filters during the formation of the encapsulation layer and may also avoid affecting the performance of the photosensitive chips by the formation process of the encapsulation layer, which may be advantageous to ensure the performance of the lens modules; and omitting the circuit boards through the encapsulation layer and the redistribution layer structure, which may reduce the total thickness of the lens modules and meet the requirements of miniaturization and ultra-thin thickness of the lens modules.

In order to make the present disclosure easy to understand, detailed steps and corresponding structures will be provided to explain the technical solutions of the present disclosure. In the following, various preferred embodiments of the present disclosure are described in detail. However, it should be noted that in addition to the embodiments described herein, the present disclosure may be implemented in other forms.

FIGS. 1-13 illustrate structural schematics corresponding to structures at certain stages of an exemplary packaging method for an image capturing assembly (e.g., a camera assembly) according to various disclosed embodiments of the present disclosure.

Figure 2:
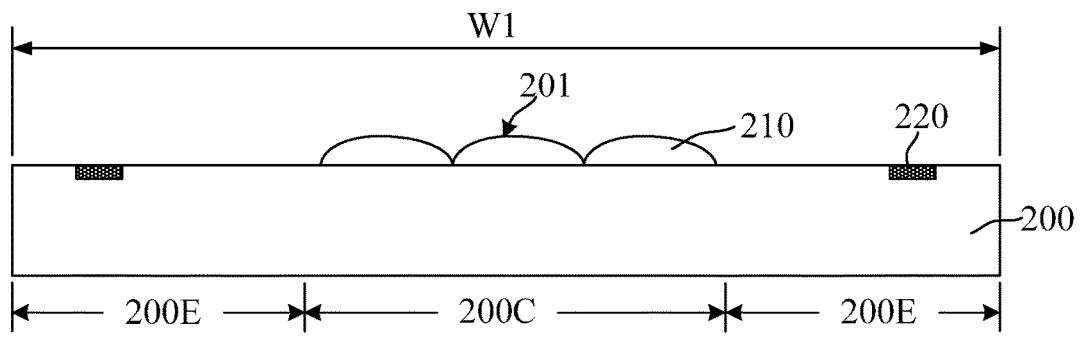

Referring to FIG. 1 and FIG. 2, FIG. 2 is an enlarged view of a photosensitive chip in FIG. 1. The photosensitive chip 200 may be provided, where the photosensitive chip 200 may have soldering pads.

The photosensitive chip 200 may be an image sensor chip. In one embodiment, the photosensitive chip 200 may be a complimentary metal-oxide-semiconductor (CMOS) image sensor (CIS) chip. In other embodiments, the photosensitive chip may also be a charge coupled device (CCD) image sensor chip.

In one embodiment, the photosensitive chip 200 may have optical signal receiving surfaces 201 (shown in FIG. 2) and may receive and sense light radiation signals through the optical signal receiving surfaces 201.

Specifically, the photosensitive chip 200 may include a photosensitive region 200C and a peripheral region 200E surrounding the photosensitive region 200C. Optical signal receiving surfaces may be in the photosensitive region 200C.

The photosensitive chip 200 may include a plurality of pixel units, so the photosensitive chip 200 may include a plurality of semiconductor photosensitive devices (not shown) and a plurality of optical filter films (not shown) on the semiconductor photosensitive devices. The optical filter films may be used to selectively absorb and pass light signals received by the optical signal receiving surfaces 201.

The photosensitive chip 200 may further include micro-lenses 210 on the optical filter films. The micro-lenses 210 may be in one-to-one correspondence with the semiconductor photosensitive devices, so the received rays from light radiation signals may be focused to the semiconductor photosensitive devices. The optical signal receiving surfaces 201 may be top surfaces of the corresponding micro-lenses 210.

It should be noted that, the photosensitive chip 200 may often be a silicon-based chip, which may be fabricated by an integrated circuit fabrication technology. The photosensitive chip 200 may have soldering pads which may be used for electrical connections between the photosensitive chip 200 and other chips or components. In one embodiment, the photosensitive chip 200 may have first chip soldering pads 220 formed in the peripheral region 200E, and the first chip soldering pads 220 may be exposed on the surface of the photosensitive chip 200 which may be on the same side of the optical signal receiving surfaces 201.

In one embodiment, the cross-section shape of the photosensitive chip 200 may be a first rectangle. In other embodiments, according to actual situations, the cross-section shape of the photosensitive chip may be other shapes such as a circular shape.

In one embodiment, the first rectangle may have a first side dimension W1 (shown in FIG. 2), where the first side dimension W1 may refer to a size of the photosensitive chip 200 along a direction in parallel with the optical signal receiving surfaces 201. For example, along the direction in parallel with the optical signal receiving surfaces 201, the first side dimension W1 may be one of length and width of the photosensitive chip 200.

Figure 3:
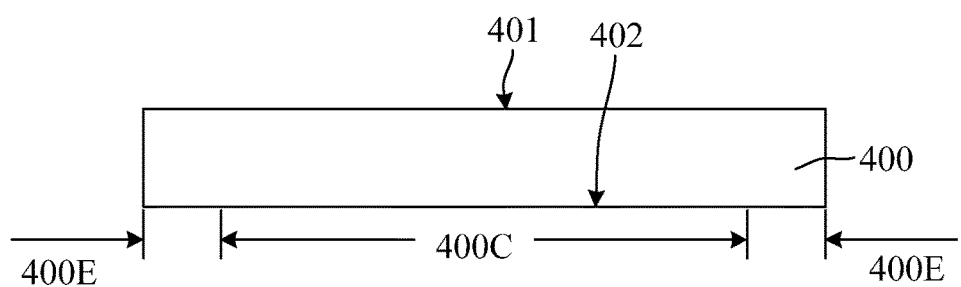

Referring to FIG. 1 and FIG. 2, and in conjunction with FIG. 3, FIG. 3 is an enlarged view of one optical filter in FIG. 1. The optical filter 400 (shown in FIG. 1) may be mounted on the photosensitive chip 200.

After mounting the optical filter 400 on the photosensitive chip 200, a photosensitive unit 250 (shown in FIG. 1) may be formed.

The optical filter 400 may be mounted on the photosensitive chip 200 to prevent the subsequent packaging process from polluting the optical signal receiving surfaces 201, and the mounting approach may be advantageous to reduce the total thickness of a subsequently formed lens module and meet the requirements of miniaturization and ultra-thin thickness of the lens module.

The optical filter 400 may be an infrared optical filter glass or a fully transparent glass. In one embodiment, the optical filter 400 may be an infrared optical filter glass and may be used to eliminate of the influence of infrared light in the incident ray on the performance of the photosensitive chips 200, which may be advantageous to improve the imaging effect. Specifically, the optical filter 400 may be an infrared cut optical filter (IRCF) and the infrared cut optical filter may be a blue glass infrared cut optical filter or may include a glass and an IR cut coating on a surface of the glass.

In one embodiment, the optical filter 400 may include a bonding surface 401 and a light incident surface 402 opposite to the bonding surface 401. The bonding surface 401 may be a surface used for mounting with the photosensitive chip 200, that is, a surface facing the photosensitive chip 200; and the light incident surface 402 may refer to a surface used for external incident ray entering in the optical filter 400, that is, a surface opposite the photosensitive chip 200.

Specifically, when the optical filter 400 is the blue glass infrared cut optical filter, a surface of the blue glass infrared cut optical filter may be coated with an anti-reflective or anti-reflection coating and a surface of the anti-reflective or anti-reflection coating may be the light incident surface 402; and when the optical filter 400 may include a glass and a IR cut coating on a surface of the glass, a surface of the IR cut coating may be the light incident surface 402. In other embodiments, when the optical filter is the fully transparent glass, any surface of the fully transparent glass may be the light incident surface.

As shown in FIG. 3, the optical filter 400 may include a light transmitting region 400C and a peripheral region 400E surrounding the light transmitting region 400C. The light transmitting region 400C may be used to let external incident ray pass through, so the optical signal receiving surfaces 201 (shown in FIG. 1) of the photosensitive chip 200 (shown in FIG. 1) may receive light signals, which may ensure the normal operational functions of the lens modules. The peripheral region 400E may reserve a position space for mounting the optical filter 400 and the photosensitive chip 200.

As shown in FIG. 1, in one embodiment, the optical filter 400 may be mounted on the photosensitive chip 200 through a bonding structure 410 and the bonding structure 410 may surround the optical signal receiving surfaces 201.

The bonding structure 410 may be used for a physical connection between the optical filter 400 and the photosensitive chip 200. The optical filter 400, the bonding structure 410 and the photosensitive chip 200 may form a cavity (not labeled), which may avoid a direct contact between the optical filter 400 and the photosensitive chip 200 and may prevent the optical filter 400 from adversely affecting the performance of the photosensitive chip 200.

In one embodiment, the bonding structure 410 may surround the optical signal receiving surfaces 201, which may place the optical filter 400 above the optical signal receiving surfaces 201 on a photosensitive path of the photosensitive chip 200 and may ensure the performance of the photosensitive chip 200.

For example, the bonding structure 410 may be made of a photolithographic material and may be formed by a photolithography process, which may not only improve the topography quality and dimensional accuracy of the bonding structure 410, packaging efficiency and production capacity, may also reduce the influence on the adhesive strength of the bonding structure 410.

In one embodiment, the bonding structure 410 may be made of a photolithographic dry film. In other embodiments, the bonding structure 410 may be made of a material including a photolithographic polyimide, a photolithographic polybenzoxazole (PBO) or a photolithographic benzocyclobutene (BCB).

In one embodiment, in order to reduce the process difficulty and simplify the process steps for forming the bonding structure 410 and also reduce the influence of forming process of the bonding structure 410 on the optical signal receiving surfaces 201, the bonding structure 410 may be formed on the optical filter 400.

Specifically, as shown in FIG. 1, the mounting step may include: providing the third carrier substrate 340; temporarily bonding the light incident surface 402 (shown in FIG. 3) to the third carrier substrate 340; after the temporary bonding, forming an annular bonding structure 410 in the peripheral region 400E (shown in FIG. 3); and forming a photosensitive unit 250 by mounting the peripheral region 200E (shown in FIG. 2) of the photosensitive chip 200 to the annular bonding structure 410, where the optical signal receiving surfaces 201 may face toward the annular bonding structure 410.

The third carrier substrate 340 may be used to provide a process platform for the mounting step of the optical filter 400 and the photosensitive chip 200, which may improve process operability; and the temporary bonding (TB) method may be convenient to separate the optical filter 400 and the third carrier substrate 340.

In one embodiment, the third carrier substrate may be a carrier wafer. In other embodiments, the third carrier substrate may be other types of substrates. Specifically, the optical filter 400 may be temporarily bonded on the third carrier substrate 340 through a first temporary bonding layer 345. The first temporary bonding layer 345 may be used as a peeling layer, which may be convenient to separate the optical filter 400 and the third carrier substrate 340 subsequently.

In one embodiment, the first temporary bonding layer 345 may be a foaming film. The foaming film may include a micro-adhesive surface and a foaming surface, facing opposite to each other. The foaming film may be viscous at room temperature and the foaming surface may be attached to the third carrier substrate 340. By subsequently heating the foaming film, the foaming film may lose its viscosity, so the optical filter 400 may be separated from the third carrier substrate 340. In other embodiments, the first temporary bonding layer may also be a die attach film (DAF).

Figure 4:
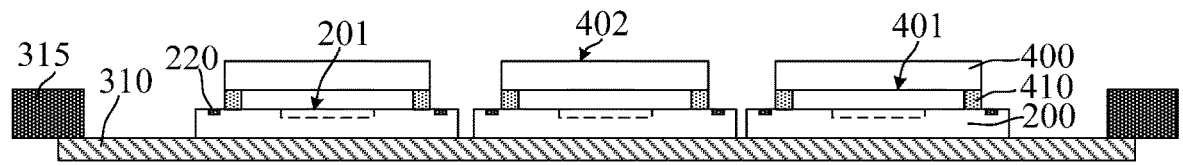

Referring to FIG. 4, it should be noted that, after forming the photosensitive unit 250, the method may further include: attaching a surface of the photosensitive chip 200 opposite to the optical signal receiving surfaces 201 to an ultra-violet (UV) film 310, and after the attaching step, removing the third carrier substrate 340 (shown in FIG. 1) by a first debonding treatment.

By attaching the photosensitive chip 200 to the UV film 310, it may be possible to provide support and fixation to the photosensitive unit 250 after removing the third carrier substrate 340. Moreover, the adhesion of the UV film 310 under UV light may be weaken and the photosensitive unit 250 may be easily removed from the UV film subsequently, which may prepare for the subsequent temporary bonding step.

For example. the UV film 310 may be attached firmly to the surface of the photosensitive chip 200 opposite to the optical signal receiving surfaces 201 by a lamination machine and may also be attached to a bottom of a frame 315 having a relatively large diameter. The frame 315 may be used to stretch the film, so the photosensitive unit 250 may be discretely fixed on the UV film. The detailed description of the UV film 310 and the frame 315 may not be described in detail herein.

In one embodiment, the first temporary bonding layer 345 (shown in FIG. 1) may be the foaming film, so a thermal debonding process may be used for the first debonding treatment. For example, a thermal treatment may be performed on the first temporary layer 345, which may make the foaming surface of the foaming film to lose viscosity, so the third carrier substrate 340 may be removed and the first temporary bonding layer 345 may be removed subsequently by tearing.

Figure 5:
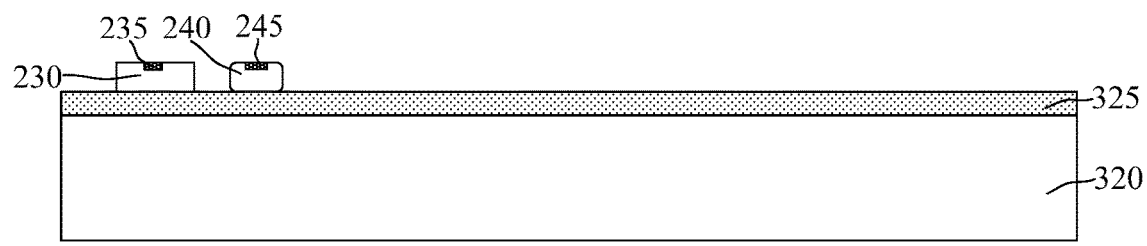

Referring to FIG. 5, a first carrier substrate 320 may be provided. Functional components (not labeled) may be temporarily bonded on the first carrier substrate 320. The functional components may have soldering pads (not labeled) and the soldering pads of the functional component may face away from the first carrier substrate 320.

The first carrier substrate 320 may be used to provide a process platform for forming a subsequent encapsulation layer.

In one embodiment, the first carrier substrate 320 may be a carrier wafer. In other embodiments, the first carrier substrate may be other types of substrates. Specifically, the functional components may be temporarily bonded on the first carrier substrate 320 through a second temporary bonding layer 325. The detailed description of the second temporary bonding layer 325 may refer to the corresponding above-mentioned description of the first temporary bonding layer 345 (shown in FIG. 1), and details may not be described herein.

In one embodiment, after the step of the temporary bonding, the soldering pads of the functional components may face away from the first carrier substrate 320, which may reduce the complexity of the subsequent electrical connection process.

It should be noted that, in order to reduce the process difficulty of the subsequent electrical connection process and the process difficulty of forming the encapsulation layer, the functional component and the photosensitive chip 200 may have same thickness or relatively small difference in thickness, where the matching thickness of the functional component may be formed according to the thickness of the photosensitive chip 200. In one embodiment, the thickness difference between the functional component and the photosensitive chip 200 may be −2 micrometers or 2 micrometers.

The functional components may be specific functional components other than the photosensitive chip 200 in the imaging capturing assembly. The functional components may include at least one of a peripheral chip 230 and a passive component 240.

In one embodiment, the functional components may include the peripheral chip 230 and the passive component 240.

The peripheral chip 230 may be an active component. After being electrically connected to the photosensitive chip 200 subsequently, the peripheral chip 230 may be used to provide the photosensitive chip 200 with a peripheral circuit such as an analog power supply circuit, a digital power supply circuit, a voltage buffer circuit, a shutter circuit, a shutter drive circuit etc.

In one embodiment, the peripheral chip 230 may include one or two of a digital signal processor chip and a memory chip. In other embodiments, the peripheral chips may also include chips with other functional types. For convenience of illustration, only one peripheral chip 230 may be shown in FIG. 5, but the number of the peripheral chips 230 may be not limited to one.

The peripheral chip 230 may usually be a silicon-based chip, which may be fabricated using an integrated circuit fabrication technology and may also have a pad for the electrical connection between the peripheral chip 230 and other chips or parts. In one embodiment, the peripheral chip 230 may include the second chip soldering pad 235. After the peripheral chip 230 is temporarily bonded on the first carrier substrate 320, the second chip soldering pad 235 may face away from the first carrier substrate 320.

The passive component 240 may be used to play a specific role in the photosensitive operation of the photosensitive chip 200. The passive component 240 may include smaller electronic components such as resistors, capacitors, inductors, diodes, triodes, potentiometers, relays or drivers. For convenience of illustration, only one passive component 240 may be shown in FIG. 5, but the number of the passive components 240 may be not limited to one.

The passive component 240 may have a soldering pad for an electrical connection between the passive component 240 and other chips or parts. In one embodiment, a soldering pad of the passive component 240 may be an electrode 245. After the passive component 240 is temporarily bonded on the first carrier substrate 320, the electrode 245 may face away from the first carrier substrate 320.

Figure 6:
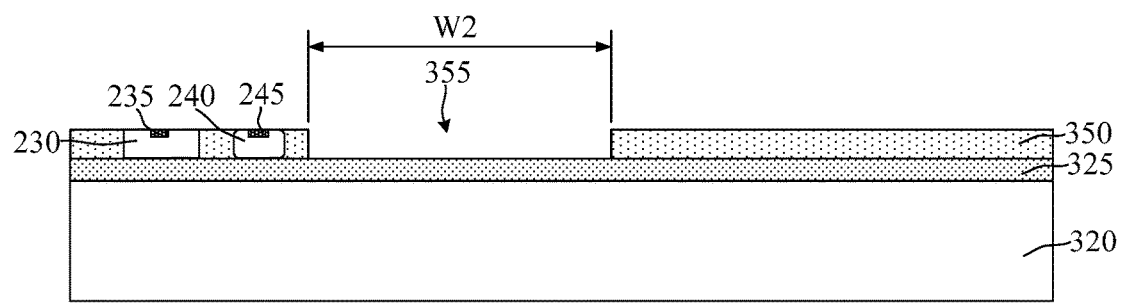

Referring to FIG. 6, an encapsulation layer 350 may be formed on the first carrier substrate 320. The encapsulation layer 350 may at least be filled between the functional components (not labeled) and a through hole 355 may be formed in the encapsulation layer 350.

The encapsulation layer 350 may be used to implement the packaging integration of the functional components and the photosensitive unit 250 (shown in FIG. 1). The encapsulation layer may not only reduce the space occupied by the holder of the lens assembly and also omit the circuit board, which may reduce the total thickness of the formed lens module and meet the requirements of the miniaturization and ultra-thin thickness of the lens module.

The encapsulation layer 350 may be made of a molding material. The encapsulation layer 350 may also function as insulation, sealing and moisture proof, which may be advantageous to improve the reliability of the formed lens module.

In one embodiment, the encapsulation layer 350 may be made of epoxy resin. Epoxy resin has advantage of low shrinkage, good adhesion, good corrosion resistance, excellent electrical properties and low cost, and is widely used a packaging material for electronic devices and integrated circuits.

The through hole 355 may be used to provide position space for the assembly of the subsequent photosensitive chip 200.

The thickness of the encapsulation layer 350 may be determined by the thickness of the photosensitive chip 200, so the encapsulation layer 350 may expose the first chip soldering pads 220 (shown in FIG. 1) after the photosensitive chip 200 is subsequently positioned into the corresponding through hole 355, which may facilitate the subsequent electrical connection process. In one embodiment, the thickness of the encapsulation layer 350 may be equal to the thickness of the photosensitive chip 200.

In one embodiment, the thickness of the photosensitive chip 200 may equal to or similar to the thickness of the peripheral chip 230 and the passive component 240, so the encapsulation layer 350 may be filled between the peripheral chip 230 and the passive component 240 and expose the second chip soldering pad 235 and the electrode 245, which may reduce the difficulty of the subsequent electrical connection process.

In one embodiment, the encapsulation layer 350 having the through hole 355 may be formed by an injection molding process. By selecting the injection molding process and preparing a matching mold, the thickness and formation area of the encapsulation layer 350 may meet the process requirements, where the process may be simple and the through hole 355 may be formed in one same step.

For example, forming the encapsulation layer 350 may include: positioning the first carrier substrate 320 temporarily bonded with the functional components into a mold, where the mold may include an upper mold and a lower mold, and any one of the upper mold and the lower mold may have a protruding boss occupying a position of the through hole 355; positioning the first carrier substrate between the upper mold and the lower mold; after a clamping, pressing the mold onto the functional components and the first carrier substrate 320 and pressing the boss onto a portion of the first carrier substrate 320 exposed by the functional components and forming a cavity between the upper mold and the lower mold; injecting a molding material into the cavity to form the encapsulation layer 350; and removing the mold to form the through hole 355 in the encapsulation layer 350.

Wherein, in the injection molding process, a release film may be attached to the surface of the mold. The release film may not only be advantageous to improve the surface smoothness of the mold, but also may separate the mold and the encapsulation layer 350 after forming the encapsulation layer 350, which may achieve the effect of demolding. In addition, the release film may a certain elasticity and thickness, so the encapsulation layer 350 may easily expose the soldering pad of each functional component even if there is a thickness difference between each functional component. Correspondingly, the step of removing the release film may be also included after the demolding.

In one embodiment, the cross-sectional shape of the photosensitive chip 200 may be a first rectangle and the cross-sectional shape of the through hole 355 may be second rectangle, that is, the through hole 355 may have vertical sidewalls, so the process difficulty of the mold may be low, which may be advantageous to ensure the topography quality and dimensional precision of the through hole 355.

In other embodiments, the mold may not be designed. Correspondingly, after forming the encapsulation layer, the encapsulation layer may be etched by a laser cutting process to form a through hole in the encapsulation layer.

In one embodiment, the second rectangle may have a second side dimension W2. The second side dimension W2 may be determined by the first side dimension W1 (shown in FIG. 2) and the second side dimension W2 may be larger than the first side dimension W1, which may reduce the assembly difficulty of the subsequent photosensitive chip 200 in the through hole 355 and reduce the damage probability of the photosensitive chip 200. The second side dimension W2 may refer to a size of the through hole 355 along a direction in parallel with a surface of the first carrier substrate 320 and the second side dimension W2 may be one of length and width of the through hole 355.

In one embodiment, the second rectangle is larger than the first rectangle, and the second rectangle has a length and a width both greater than the first rectangle. That is, any second side dimension W2 of the second rectangle is greater than a corresponding first side dimension W1 of the first rectangle, in order to enable the through hole 355 to accommodate the photosensitive chip 200 to be placed there-in.

However, the difference between the second side dimension W2 and the corresponding first side dimension W1 may not be too large. If the difference is too large, the size of subsequently formed image capturing assembly may be increased correspondingly and the bonding difficulty between the subsequent photosensitive chip 200 and the encapsulation layer 350 may be easily increased. In such way, in one embodiment, the difference between the second side dimension W2 and the corresponding first side dimension W1 may be larger than 0 micrometer, and less than or equal to 20 micrometers, where the minimum value of the difference may be any suitable value as long as the subsequent photosensitive chip 200 is able to be placed in the through hole 355.

In other embodiments, the difference may be 0 when the assembly precision is sufficiently high.

It should be noted that, using the encapsulation layer 350, the circuit board may be omitted, and the thickness of the lens module may be reduced, so the photosensitive chip 200 and the peripheral chip 230 may not need to be thinned, which may improve the mechanical strength and reliability of the photosensitive chip 200 and the peripheral chip 230. In other embodiments, the thickness of the photosensitive chip and the peripheral chip may be appropriately thinned according to the process requirements, but the thinning amount may be relatively small to ensure that the mechanical strength and reliability may not be affected.

It should also be noted that, in one embodiment, only one through hole 355 may be illustrated. In other embodiments, the number of the through holes in the encapsulation layer may be plural when the formed lens module may be applied to a dual-camera or array module product.

Figure 7:
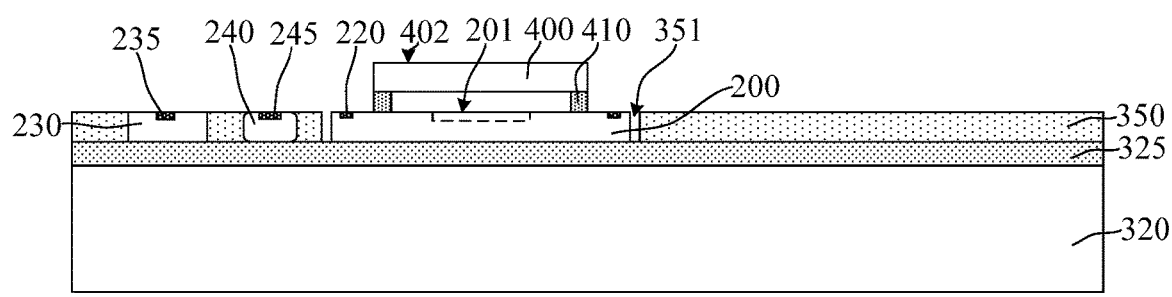

Referring to FIG. 7, the photosensitive chip 200 may be placed in the through hole 355 (shown in FIG. 5) and the photosensitive chip 200 may be temporarily bonded on the first carrier substrate 320. The soldering pads of the photosensitive chip 200 may face away from the first carrier substrate 320.

By placing the photosensitive chip 200 in the through hole 355, the packaging integration of the photosensitive chip 200 and the functional components may be realized. In addition, the rupture of the optical filter 400 during the formation of the encapsulation layer 350 may be avoided and the effect of the formation of the encapsulation layer 350 on the performance of the photosensitive chip 200 may also be avoided, which may ensure the performance of the lens module.

For example, the UV film 310 at the position of a single photosensitive unit 250 may be irradiated with UV light. The UV film 310 irradiated with UV light may lose its viscosity, and the single photosensitive unit 250 may be lifted by a thimble. Then the photosensitive unit 250 may be lifted by a suction device, the photosensitive unit 250 may be peeled off from the UV film 310 and may be placed on the first carrier substrate 320 exposed by the through hole 355 sequentially. The positional precision of the photosensitive unit 250 in the through hole 355 may be improved by temporarily bonding the photosensitive unit 250 on the first carrier substrate 320 one by one.

In one embodiment, the thickness of the encapsulation layer 350 may be determined by the thickness of the photosensitive chip 200. Therefore, after the photosensitive chip 200 is placed in the through hole 355, the optical filter 400 may be outside the through hole 355.

It should be noted that, the second side dimension W2 (shown in FIG. 5) of the through hole 355 may be larger than the first side dimension W1 (shown in FIG. 2) of the photosensitive chip 200, so the gap 351 may be formed between the sidewalls of the through hole 355 and the photosensitive chip 200.

Figure 8:
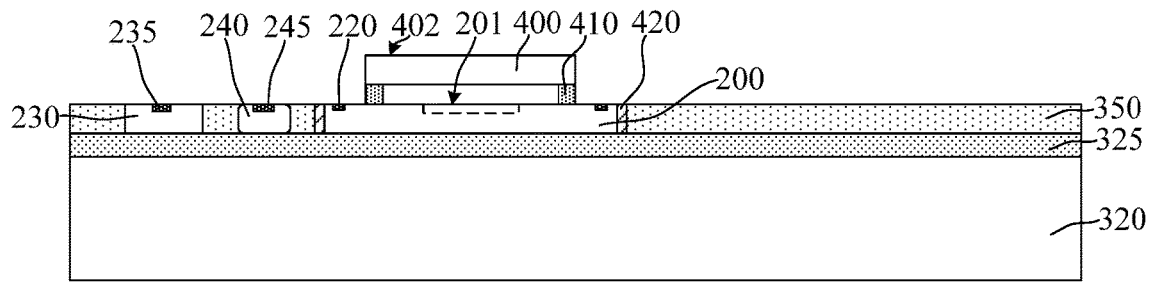

Referring to FIG. 8, the packaging method may further include: filling the gap 351 (shown in FIG. 6) with an adhesive 420.

The adhesive 420 may be used to realize a physical connection between the photosensitive chip 200 and the encapsulation layer 350, so the photosensitive chip 200 may be fixed in the encapsulation layer 350.

In one embodiment, the material of the adhesive 420 may be an epoxy adhesive and the material of the encapsulation layer 350 may be an epoxy resin. The compatibility of the adhesive 420 and the encapsulation layer 350 may be improved by selecting an epoxy adhesive matching the material of the encapsulation layer 350.

It should also be noted that, in one embodiment, after the optical filter 400 is mounted on the photosensitive chip 200, the photosensitive chip 200 may be temporarily bonded on the first carrier substrate 320. In other embodiments, after the photosensitive chip is temporarily bonded on the first carrier substrate, the optical filter may be mounted on the photosensitive chip.

Referring to FIG. 9 to FIG. 12, after the photosensitive chip 200 is temporarily bonded on the first carrier substrate 320, a redistribution layer (RDL) structure 360 (shown in FIG. 10) may be formed to electrically connect the soldering pads of the photosensitive chip 200 with the soldering pads of the functional components (not labeled).

The redistribution layer structure 360 may be used to implement electrical integration of the formed image capturing assembly.

By selecting the redistribution layer structure 360, a distance between the photosensitive chip 200 and the functional component may be reduced, which may improve the feasibility of the electrical connection process. In addition, compared with a wire bond process, the redistribution layer structure 360 may realize mass production to improve packaging efficiency.

In one embodiment, the soldering pads of the photosensitive chip 200 and the soldering pads of the functional components may all face away from the first carrier substrate 320. Therefore, the redistribution layer structure 360 may be formed on the side adjacent to the optical filter 400 on the encapsulation layer 350 to reduce the difficulty of the electrical connection process. In addition, after the lens assembly is subsequently assembled to the formed image capturing assembly, the redistribution layer structure 360 may be in the holder of the lens assembly, which may improve packaging reliability.

For example, the redistribution layer structure 360 may electrically connect the first chip soldering pads 220, the second chip soldering pad 235 and the electrode 245.

Figure 9:
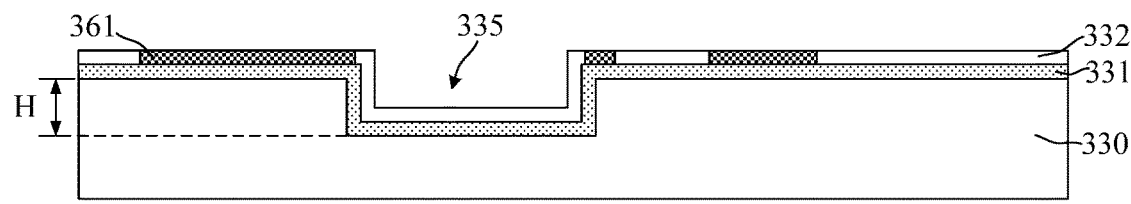

In one embodiment, the step of forming the redistribution layer structure 360 may include: referring to FIG. 9, providing a second carrier substrate 330 and forming interconnect lines 361 on the second carrier substrate 330.

By forming the interconnect lines 361 on the second carrier substrate 330, the process of forming the interconnect lines 361 may be prevented from contaminating the optical filter 400.

For example, forming the interconnect lines 361 on the second carrier substrate 330 may include: forming a first dielectric layer 332 on the second carrier substrate 330; patterning the first dielectric layer to form an interconnect trench (not shown) in the first dielectric layer; forming the interconnect lines 361 in the interconnect trench; and after forming the interconnect lines 361, removing the first dielectric layer 332.

The interconnect trench in the first dielectric layer 332 may be used to define the shape, location and size of the interconnect lines 361. In one embodiment, the material of the first dielectric layer 332 may be a photosensitive material, which may be patterned by a photolithography process and may simplify the process difficulty of forming the interconnect trench. For example, the material of the first dielectric layer 332 may be photosensitive polyimide, photosensitive benzocyclobutene or photosensitive polybenzoxazole.

In one embodiment, the interconnect lines 316 may be formed in the interconnect trench by an electroplating process.

In one embodiment, the material of the interconnect lines 361 may be made of copper. The copper has low resistivity, which may improve the conductive performance of the interconnect lines 361, and the copper has good filling performance, which may improve the filling quality of the interconnect lines 361 in the interconnect trench. In other embodiments, the material of the interconnect lines may be made of other suitable conductive materials.

In one embodiment, the material of the first dielectric layer 232 may have relatively strong corrosion resistance. Therefore, after forming the interconnect lines 361, the first dielectric layer 332 may be removed by a reactive ion etching process and the interconnect lines 361 may be exposed by the second carrier substrate 330, which may prepare the process for the subsequent electrical connection process.

In one embodiment, before forming the first dielectric layer 332 on the second carrier substrate 330, the method may further include: forming a third temporary bonding layer 331 on the second carrier substrate 330 and forming the first dielectric layer 332 on the third temporary bonding layer 331.

The third temporary bonding layer 331 may be used as a peeling layer, which may be convenient to separate the interconnect lines 361 and the second carrier substrate 330. In one embodiment, the third temporary bonding layer 331 may be a foaming film. The detailed description of the third temporary layer 331 may refer to the corresponding abovementioned description of the first temporary bonding layer 345 (shown in FIG. 1), and details may not be described herein.

It should be noted that, in other embodiments, before forming the third temporary bonding layer on the second carrier substrate, the method may further include: forming a passivation layer on the second carrier substrate. The passivation layer may be used to prevent the second carrier substrate from being contaminated, so the second carrier substrate may be reused, where the material of the passivation layer may be made of a material including silicon dioxide or silicon nitride.

In one embodiment, the optical filter 400 may be outside the through hole 355, and the first chip soldering pads 220, the second chip soldering pad 235 and the electrode 245 may be on the same side of the encapsulation layer 350. Therefore, before forming the third temporary bonding layer 331, the method may further include: etching the second carrier substrate 330 to form the trench 335 in the second carrier substrate 330, where the trench 335 may contain the optical filter 400. In such way, the third temporary bonding layer 331 may conformally cover the surface of the second carrier substrate 330 and a bottom and sidewalls of the trench 335, and the first dielectric layer 332 may conformally cover the surface of the third temporary bonding layer 331.

In one embodiment, after forming the interconnect lines 361, the difference between the distance, which is between the light incident surface 402 and the optical signal receiving surface 201, and the thickness of the interconnect lines 361 is a first value. The depth H of the trench 335 formed in the second carrier substrate 330 is a second value. The difference between the first value and the second value may be larger than or equal to 5 micrometers, which may ensure that the interconnect lines 361 may be electrically connected to the first chip soldering pads 220, the second chip soldering pad 235 and the electrode 245.

Figure 10:
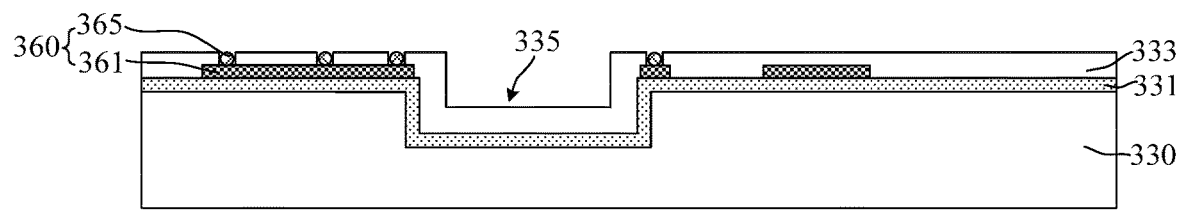

Referring to FIG. 10, after removing the first dielectric layer 332 (shown in FIG. 9), conductive bumps 365 may be formed on the interconnect lines 361.

In one embodiment, the conductive bumps 365 and the interconnect lines 361 may form the redistribution layer structure 360.

The conductive bumps 365 may protrude from the interconnect lines 361. The reliability of the subsequent bonding between the interconnect lines 361 and the soldering pads may be improved through the conductive bumps 365.

In addition, the conductive bumps 365 may have a certain height. The depth H (shown in FIG. 9) of the trench 335 formed in the second carrier substrate 330 may be reduced through the conductive bumps 365, and the formation of the trench in the second carrier substrate may be avoided, which may reduce the complexity of the process.

For example, forming the conductive bumps 365 on the interconnect lines 361 may include: forming a second dielectric layer 333 which may conformally cover the third temporary bonding layer 331 and also cover the interconnect lines 361; patterning the second dielectric layer 333 to form conductive through holes (not shown) in the second dielectric layer 333, where the conductive through holes may expose a portion of the interconnect lines 361; forming the conductive bumps 365 in the conductive through holes; and removing the second dielectric layer 333.

The conductive through holes in the second dielectric layer 333 may be used to define the shape, location and size of the conductive bumps 365. The detailed description of the second dielectric layer 333 may refer to the corresponding above-mentioned description of the first dielectric layer 332, and details may not be described herein.

In one embodiment, the conductive bumps 365 may be formed in the conductive through holes by an electroplating process.

In one embodiment, in order to improve the compatibility of the conductive bumps 365 and the interconnect lines 361, and the conductive performance of the redistribution layer structure 360, the material of the conductive bumps 365 and the interconnect lines 361 may be made of copper. In other embodiments, other suitable conductive materials may be used.

In one embodiment, after forming the conductive bumps 365, the second dielectric layer 333 may be removed by a reactive ion etching process.

Figure 11:
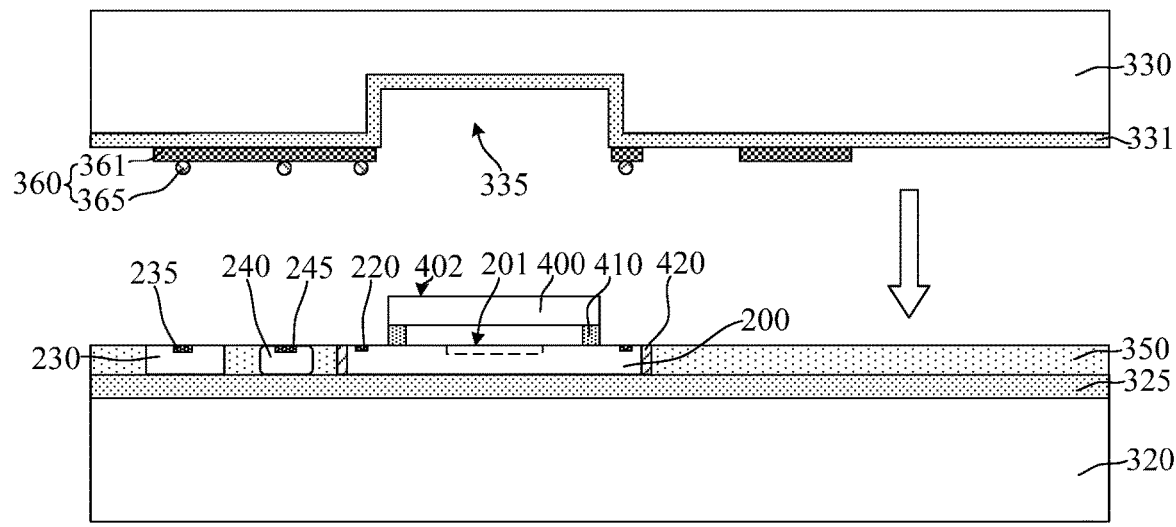
Figure 12:
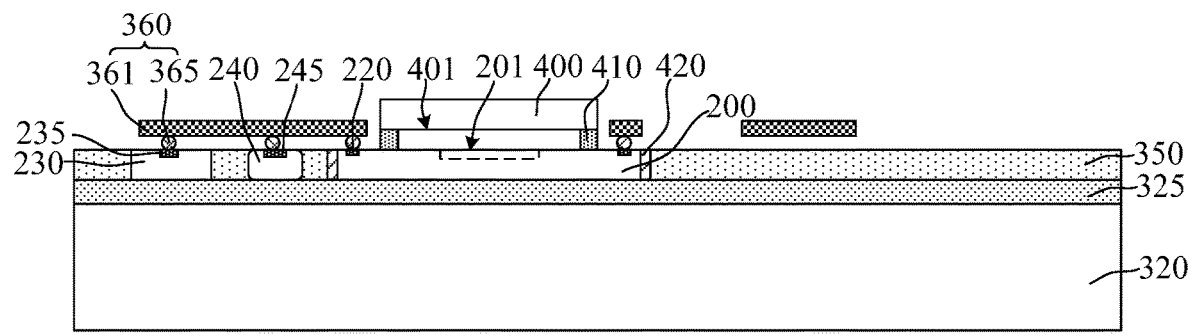

Referring to FIG. 11 and FIG. 12, the conductive bumps 365 may be bonded to the corresponding soldering pads and may be electrically connected with the corresponding soldering pads.

For example, after the conductive bumps 365 are placed on the first chip soldering pads 220, the second chip soldering pad 235 and the electrode 245, the bonding step may be performed by a metal bonding process.

After the conductive bumps 365 are placed on the first chip soldering pads 220, the second chip soldering pad 235 and the electrode 245, the optical filter 400 may be placed in the trench 335 (shown in FIG. 11).

In one embodiment, the metal bonding process may be a thermocompression bonding process. During the metal bonding process, the contact surface between the conductive bumps 365 and their corresponding soldering pads may be plastically deformed under pressure, so the atoms on the contact surface may contact each other and the atomic diffusion on the contact surface may accelerate to achieve transboundary diffusion when the bonding temperature increases; and when a certain bonding time is reached, the lattice of the contact surface may reorganized to achieve the bonding, so the bonding strength, electrical and thermal conductive properties, electromigration resistance and mechanic connection properties may be relatively high.

As the bonding temperature increases, the atoms on the contact surface may gain more energy and the diffusion between atoms may be more obvious. In addition, the increase in bonding temperature may also promote crystallite growth and the crystallite gaining energy may grow across the interface, which may be advantageous to eliminate the interface and integrate the materials of the contact surface. However, if the bonding temperature is too high, it may be easy to adversely affect the performance of the photosensitive chip 200 and the peripheral chip 230, especially for the sensitive components in the formed image capturing assembly. In addition, if the process temperature is too high, it may cause thermal stress, decreased alignment precision, increased process cost and reduced production efficiency etc. In one embodiment, the metal bonding process may be a metal low temperature bonding process, and the bonding temperature of the metal bonding process may less than or equal to 250° C., where the lowest value of the bonding temperature may be sufficient as long as the bonding may be achieved.

At the setting of the bonding temperature, by increasing the pressure, mutual diffusion between atoms may be easier, which may improve the bonding quality between the conductive bumps 365 and the soldering pads. In one embodiment, the pressure of the metal bonding process may be greater than or equal to 200 kPa, where the pressure may be generated by a pressing tool.

Increasing the bonding time may also improve the bonding quality. In one embodiment, the bonding time of the metal bonding process may be longer than or equal to 30 min.

It should be noted that, in some embodiments, the bonding temperature, pressure and bonding time may be reasonably adjusted to match each other, which may ensure the quality and efficiency of the metal bonding process.

It should also be noted that, in order to reduce the probability of oxidation or contamination of the contact surface, the metal bonding process may be performed in a vacuum environment.

In addition, in other embodiments, the conductive bumps may also be formed respectively on the soldering pads of the photosensitive chips and the soldering pads of the functional components and the conductive bumps may be electrically connected to the soldering pads.

Specifically, forming the redistribution layer structure may further include: providing the second carrier substrate and forming the interconnect lines on the second carrier substrate; forming the conductive bumps on the soldering pads of the photosensitive chips and the soldering pads of the functional components respectively; and bonding the interconnect lines on the conductive bumps where the bonded conductive bumps and interconnect lines may form the redistribution layer structure.

By forming the conductive bumps on the soldering pads, it may be advantageous to improve the positional precision of the conductive bumps and reduce the process difficulty of forming the conductive bumps.

In one embodiment, the conductive bumps may be formed by using a soldering ball process. By selecting the soldering ball process, it may be advantageous to improve the reliability of signal transmission between each of chips and components and the redistribution layer structure. For example, the material of the conductive bumps may be made of tin.

As shown in FIG. 12, in one embodiment, after the redistribution layer structure 360 is electrically connected to corresponding the first chip soldering pads 220, the second chip soldering pad 235 and the electrode 245, a second debonding treatment may be performed to remove the second carrier substrate 330 (shown in FIG. 11) and the third temporary bonding layer 331 (shown in FIG. 11).

The redistribution layer structure 360 may be exposed by removing the second carrier substrate 330 and the third temporary bonding layer 331, which may prepare for the subsequent process. The detailed description of the second debonding treatment may refer to the corresponding above-mentioned description of the first debonding treatment, and details may not be described herein.

Figure 13:
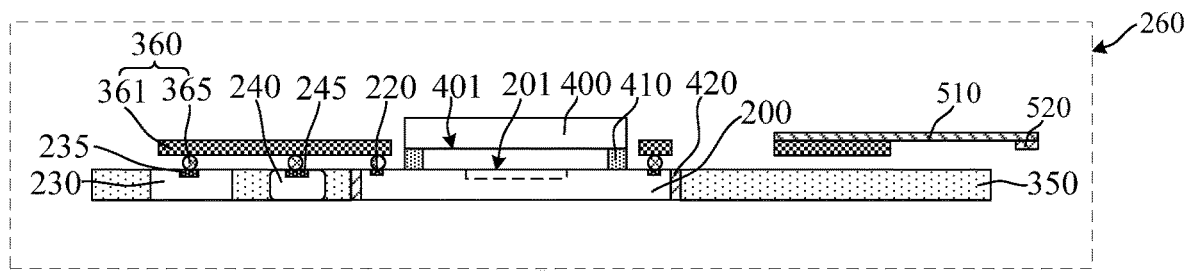

Referring to FIG. 13, a third debonding treatment may be performed to remove the first carrier substrate 320 (shown in FIG. 12).

The first carrier substrate 320 may be used to provide a process platform for forming the encapsulation layer 350 and the assembly of the photosensitive chip 200 (shown in FIG. 1) in the through hole 355 (shown in FIG. 6), so the first carrier substrate 320 may be removed after the photosensitive chip 200 is fixed in the encapsulation layer 350.

In one embodiment, after the electrical connection of the redistribution layer structure 360 to each soldering pad, the first carrier substrate 320 may be removed, which may improve the operability and process stability of the bonding process. In other embodiments, the first carrier substrate may be removed after assembling the photosensitive chip in the through hole and before forming the redistribution layer structure.

In one embodiment, forming the third debonding treatment may include: successive removing the first carrier substrate 320 and the second temporary bonding layer 325 (shown in FIG. 12). A detailed description of the third debonding treatment may refer to the corresponding above-mentioned description of the second debonding treatment, and details may not be described herein.

It should be noted that, after removing the first carrier substrate 320, the method may further include: performing a dicing treatment on the encapsulation layer 350. A single image capturing assembly 260 with a size matching the process requirement may be formed by the dicing treatment, which may prepare the process for the assembly of subsequent lens assembly. In one embodiment, the dicing treatment may be performed by a laser cutting process.

In one embodiment, the third debonding treatment may be performed first and then the dicing treatment may be performed. In other embodiments, the third debonding treatment may be performed after the dicing treatment, and the first carrier substrate may further provide a process platform for the dicing treatment accordingly.

With continued reference to FIG. 13, after forming the redistribution layer structure 360 which may be connected to the soldering pads electrically, the method may further include: bonding a flexible printed circuit (FPC) board 510 on the redistribution layer structure 360.

The bonded FPC board 510 may be used to implement the electrical connection between the image capturing assembly 260 and the subsequent lens assembly, and the electrical connection between the formed lens module and other components without using a circuit board. In addition, after forming the subsequent lens module, the lens module may be also electrically connected to other components in the electronic device through the FPC board 510, which may implement normal image capturing function of the electronic device.

In one embodiment, the FPC board 510 may have a circuit structure, so the FPC board 510 may be bonded to the redistribution layer structure 360 by the metal bonding process, which may achieve the electrical connection It should be noted that, the connector 520 may be formed on the FPC board 510 for electrically connecting the FPC board 510 with other circuit components. When the lens module is applied to an electronic device, the connector 520 may be electrically connected to the mother board of the electronic device, so the information transmission between the lens module and other components in the electronic device may be achieved and image information of the lens module may be transmitted to the electronic device. For example, the connector 520 may be a gold finger connector.

It should be noted that, in order to improve process feasibility, the FPC board 510 may be bonded on the redistribution layer structure 360 after the dicing treatment and the second debonding treatment.

FIGS. 14-18 illustrate structural schematics corresponding to structures at certain stages of another exemplary image capturing assembly packaging method according to various disclosed embodiments of the present disclosure.

The similarity between the present embodiment and the previous embodiment may be not described herein. The difference between the present embodiment and the previous embodiment is: as shown in FIG. 15, after placing a photosensitive chip 200a in a corresponding through hole 355a (shown in FIG. 14), an optical filter 400a may be located in the through hole 355a.

Figure 17:
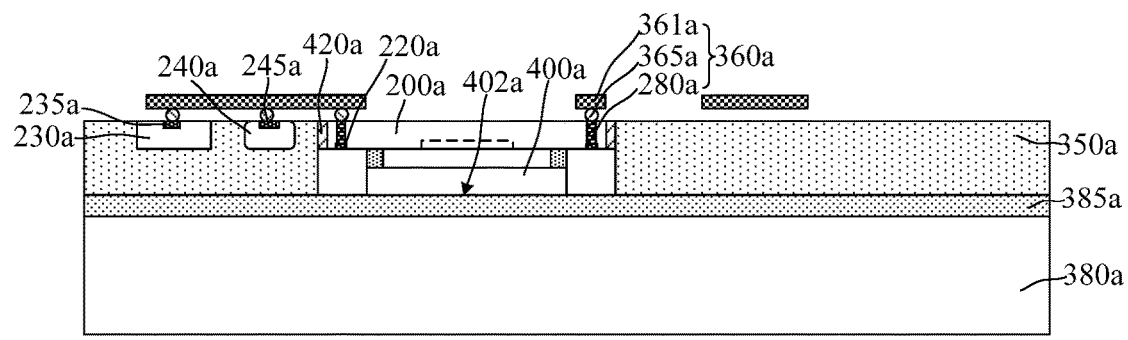

Accordingly, as shown in FIG. 17, in consideration of the feasibility of the electrical connection process, a redistribution layer structure 360a may be formed on the side of an encapsulation layer 350a away from the optical filter 400a.

Figure 14:
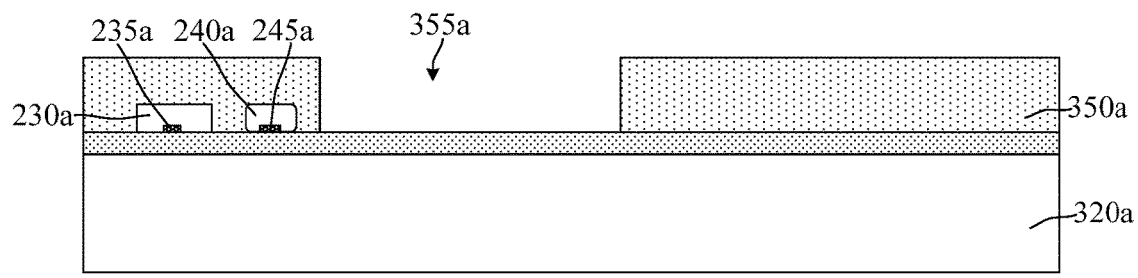
FIGS. 14-18 illustrate structural schematics corresponding to structures at certain stages of another exemplary image capturing assembly packaging method according to various disclosed embodiments of the present disclosure.
Figure 15:
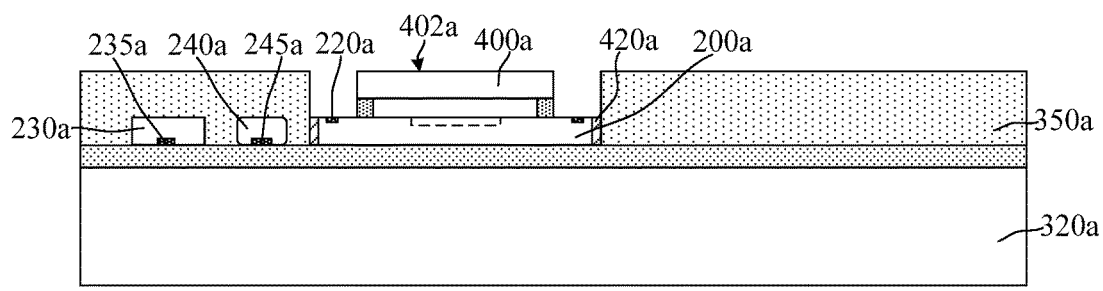

For example, the encapsulation method may include: referring to FIG. 14, after temporary bonding of the functional components on a first carrier substrate 320a, the soldering pads of the functional components may face the first carrier substrate 320a.

In one embodiment, the functional components may include a peripheral chip 230a and a passive component 240a. The soldering pad of the peripheral chip 230a may be a second chip soldering pad 235a and the soldering pad of the passive component 240a may be an electrode 245a.

By having the second chip soldering pad 235a and the electrode 245a facing the first carrier substrate 320a, the process complexity of forming the redistribution layer structure may be reduced.

With continued reference to FIG. 14, the encapsulation layer 350a may be formed on the first carrier substrate 320a, and the encapsulation layer 350a may cover the first carrier substrate 320a and functional components.

The encapsulation layer 350a may cover the peripheral chip 230a and the passive component 240a, and the thickness difference between the photosensitive chip 200a, the peripheral chip 230a and the passive component 240a may be prevented from being controlled.

The thickness of the encapsulation layer 350a may be determined by the total thickness of the photosensitive unit (not labeled).

In one embodiment, in order to reduce the thickness of the image capturing assembly, the thickness of the encapsulation layer 350a may equal to the total thickness of the photosensitive unit. In other embodiments, the thickness of the encapsulation layer may be larger than the thickness of the photosensitive unit.

Referring to FIG. 15, the photosensitive chip 200a and the optical filter 400a may be placed in the corresponding through hole 355a, and the photosensitive chip 200a may be temporarily bonded on the first carrier substrate 320a.

In one embodiment, the thickness of the encapsulation layer 350a may equal to the thickness of the photosensitive unit, so a surface of the encapsulation layer 350a facing away from the first carrier substrate 320a and a light incident surface of the optical filter 400a may have same height. In other embodiments, the surface of the encapsulation layer facing away from the first carrier substrate may be higher than the light incident surface or lower than the light incident surface.

It should be noted that, after placing the photosensitive chip 200a and the optical filter 400a in the corresponding through hole 355a, there may be a gap (not labeled) between sidewalls of the through hole 355a and the photosensitive chip 200a, so the method may further include: filling the gap with an adhesive 420a to fix the photosensitive chip 200a in the encapsulation layer 350a.

Figure 16:
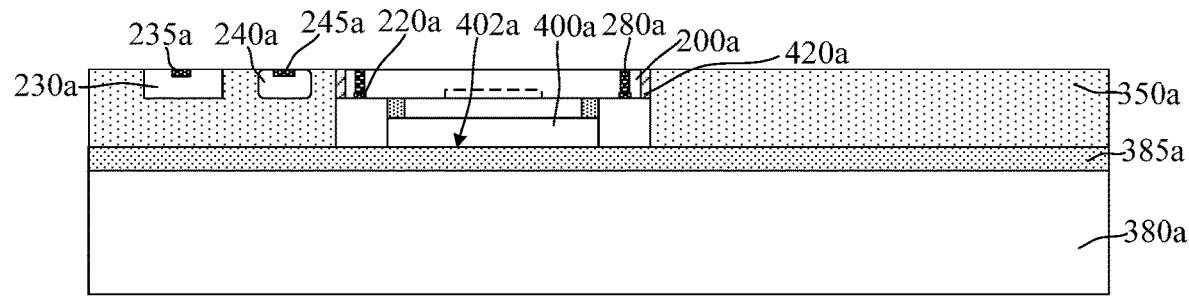

Referring to FIG. 16, after filling the gap (not labeled) with the adhesive 420a, the first carrier substrate 320a may be removed.

The soldering pads of the functional components and the face of the photosensitive chip 200a facing away from the optical filter 400a may be exposed by removing the first carrier substrate 320a, which may prepare for the subsequent electrical connection process.

Referring to FIG. 16 and FIG. 17, after removing the first carrier substrate 320a, a redistribution layer structure 360a (shown in FIG. 17), which may be electrically connected to the soldering pads, may be formed on a surface of the encapsulation layer 350a away from the side of the optical filter 400a.

For example, forming the redistribution layer structure 360a may further include: referring to FIG. 16, conductive columns 280a may be formed in the photosensitive chip 200a, and the conductive columns 280a may be electrically connected to first chip soldering pads 220a of the photosensitive chip 200a.

The photosensitive chip 200a may expose a top surface of the conductive columns 280a, and the conductive columns 280a may be used as an external electrode of the photosensitive chip 200a, which may realize an electrical connection between the first chip soldering pads 220a and the soldering pads of the functional components. The top surface of the conductive columns 280a may refer to a surface of the conductive columns 280a facing away from the optical filter 400a along the extending direction of the conductive columns 280a.

In one embodiment, the material of the conductive columns 280a may be made of copper, which may improve the conductive performance of the conductive columns 280a and reduce the process difficulty of forming the conductive columns 280a. In other embodiments, the conductive columns may be made of other suitable material such as tungsten.

For example, the conductive columns 280a may be formed using a through-silicon via (TSV) process.

It should be noted that, after removing the first carrier substrate 320a and before forming the conductive columns 280a, the method may further include: temporary bonding a surface of the encapsulation layer 350a facing away from the second chip soldering pad 235a and the electrode 245a on a fourth carrier substrate 380a. The fourth carrier substrate 380a may be used to provide a process platform for forming the conductive columns 280a and for subsequent steps.

In one embodiment, the encapsulation layer 350a may be bonded on the fourth carrier substrate 380a using a fourth temporary bonding layer 385a. The detailed description of the fourth carrier substrate 380a and the fourth temporary bonding layer 385a may refer to the corresponding description in the above-mentioned embodiments, and details may not be described herein.

Referring to FIG. 17, conductive bumps 365a and interconnect lines 361a may be formed, and the conductive bumps 365a may connect the conductive columns 280a with the soldering pads of the functional chips.

The conductive columns 280a, the conductive bumps 365a and the interconnect lines 361a may constitute the redistribution layer structure 360a.

For example, after forming the conductive bumps 365a on the interconnect lines 361a, the conductive bumps 365a may be bonded to the soldering pads of corresponding conductive columns 280a and the functional components; or after forming the conductive bumps 365a on the conductive columns 280a and the soldering pads of the functional components respectively, the interconnect lines 361a may be bonded to the conductive bumps 365a.

When the conductive bumps 365a are formed on the interconnect lines 361a, an electroplating process may be used to form the conductive bumps 365a; and when the conductive bumps 365a are formed on the conductive columns 280a and the soldering pads of the functional components, a soldering ball process may be used to form the conductive bumps 365a.

In one embodiment, a metal bonding process may be used to perform the bonding step.

A detailed description of the forming steps of the conductive bumps 365a and the interconnect lines 361a, and the bonding step may refer to the corresponding description in the above-mentioned embodiments, and details may not be described herein.

Figure 18:
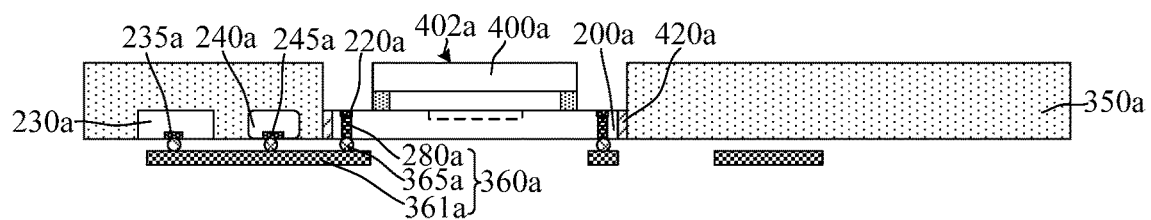

Referring to FIG. 18, after forming the redistribution layer structure 360a, the method may further include: removing the fourth carrier substrate 380a (shown in FIG. 17) and the fourth temporary bonding layer 385a (shown in FIG. 17).

The fourth carrier substrate 380a and the fourth temporary bonding layer 385a may be removed to prepare a process for the subsequent dicing treatment. A detailed description of the removing steps of the fourth carrier substrate 380a and the fourth temporary bonding layer 385a, and the subsequent steps may refer to the corresponding description in the above-mentioned embodiments, and details may not be described herein.

A detailed description of the packaging method in the present disclosure may refer to the corresponding description in the above-mentioned embodiments, and details may not be described herein.

Correspondingly, the present disclosure may further provide an image capturing assembly. FIG. 13 illustrate a structural schematic corresponding to an exemplary image capturing assembly of the present disclosure.

The image capturing assembly 260 may include: an encapsulation layer 350 and functional components (not labeled) embedded in the encapsulation layer 350, where the encapsulation layer 350 may include the opposing top surface (not labeled) and bottom surface (not labeled); the top surface and bottom surface of the encapsulation layer 350 may expose the functional components; and a through hole 355 (shown in FIG. 6) may be formed in the encapsulation layer 350, where the functional chips may have soldering pads (not labeled) and the soldering pads of the functional chips may face away from the bottom of the encapsulation layer 350; a photosensitive unit 250 (shown in FIG. 1) including a photosensitive chip 200 and an optical filter 400 mounted on the photosensitive chip 200, where the photosensitive chip 200 may be embedded in the through hole 355; the optical filter 400 may be outside the through hole 355, where the top surface and bottom surface of the encapsulation layer 350 may expose the photosensitive chip 200; the photosensitive chip 200 may have soldering pads; and the soldering pads of the photosensitive chip 200 may face away from the bottom of the encapsulation layer 350; and a redistribution layer structure 360, which may be located on the top side of the encapsulation layer 350 and may be connected to the soldering pads of the photosensitive chip 200 and the soldering pads of the functional components.

The encapsulation layer 350 may be used to fix the photosensitive chip 200 and the functional components and implement the packaging integration of the functional components and the photosensitive chip 200. The encapsulation layer 350 may not only reduce the space occupied by the holder of the lens assembly and also omit the circuit board, which may reduce the total thickness of the formed lens module and meet the requirements of the miniaturization and ultra-thin thickness of the lens module.

The material of the encapsulation layer 350 may be a molding material. The encapsulation layer 350 may also function as insulation, sealing and moisture proof, which may be advantageous to improve the reliability of the formed lens module. In one embodiment, the encapsulation layer 350 may be made of an epoxy resin.

In one embodiment, the encapsulation layer 350 may include opposing top and bottom surfaces, where the top surface of the encapsulation layer 350 may be a surface for mounting the lens assembly.

The through hole 355 may be used to provide positional space for the assembly of the photosensitive chip 200 in the encapsulation layer 350.

It should be noted that, in one embodiment, only one through hole 355 may be illustrated. In other embodiments, the number of the through holes in the encapsulation layer may be plural when the formed lens module may be applied to a dual-camera or array module product.

It should also be noted that, the cross-section shape of the photosensitive chip 200 may be a rectangle and the cross-section shape of the through hole 355 is a rectangle correspondingly. Specifically, the cross-sectional shape of the photosensitive chip 200 may be a first rectangle and the cross-sectional shape of the through hole 355 may be second rectangle. The side dimension of the second rectangle (not labeled) may be determined by the side dimension of the first rectangle (not labeled), and the side dimension of the second rectangle may be larger than the corresponding side dimension of the first rectangle, which may reduce the assembly difficulty of the photosensitive chip 200 in the through hole 355.

However, the side dimension difference between the second rectangle and the first rectangle may not be too large. If the difference is too large, the size of the image capturing assembly 260 may be increased correspondingly and the bonding difficulty between the photosensitive chip 200 and the encapsulation layer 350 may be easily increased. In such way, in one embodiment, the difference between the second side dimension and the corresponding first side dimension may be larger than 0 micrometer, and less than or equal to 20 micrometers, where the minimum value of the difference may be as long as the subsequent photosensitive chip 200 may be placed in the through hole 355. In other embodiments, the difference may also be 0 when the assembly precision is relatively high.

In one embodiment, in order to reduce the difficulty of the electrical connection between the photosensitive chip 200 and the functional components, the optical filter 400 may be located outside the through hole 355 and the top and bottom surface of the encapsulation layer 350 may expose the photosensitive chip 200 and the functional components.

In one embodiment, the photosensitive chip 200 may be a CMOS image sensor chip. In other embodiments, the photosensitive chip may also be a CCD image sensor chip.

In one embodiment, the photosensitive chip 200 may include a photosensitive region 200C (shown in FIG. 2) and a peripheral region 200E (shown in FIG. 2) surrounding the photosensitive region 200C. The photosensitive chip 200 may also have the optical signal receiving surfaces 201 in the photosensitive region 200C.

The photosensitive chip 200 may be a silicon-based chip. The soldering pads of the photosensitive chip 200 may be used for the electrical connection between the photosensitive chip 200 and other chips or components. In one embodiment, the photosensitive chip 200 may have the first chip soldering pads 220 on the peripheral region 200E.

In one embodiment, the first chip soldering pads 220 may face toward the optical filter 400, that is, the first chip soldering pads 220 may face away from the bottom of the encapsulation layer 350.

The optical filter 400 may be mounted on the photosensitive chip 200 to prevent the packaging process from polluting the optical signal receiving surfaces 201, and the mounting approach may reduce the total thickness of the lens module 600 and meet the requirements of miniaturization and ultra-thin thickness of the lens modules.

In order to achieve the normal function of the lens module, the optical filter 400 may be an infrared optical filter glass or a fully transparent glass. In one embodiment, the optical filter 400 may be an infrared optical filter glass and may be used to eliminate of the influence of infrared light in the incident light on the performance of the photosensitive chips 200, which may be advantageous to improve the imaging effect.

In one embodiment, the optical filter 400 and the photosensitive chip 200 may be mounted by the bonding structure 410 disposed there-between and the bonding structure 410 may surround the optical signal receiving surfaces 201 of the photosensitive chip 200.

The bonding structure 410 may be used for a physical connection between the optical filter 400 and the photosensitive chip 200, and may avoid a direct contact between the optical filter 400 and the photosensitive chip 200, which may prevent the optical filter 400 from adversely affecting the performance of the photosensitive chip 200.

In one embodiment, the bonding structure 410 may surround the optical signal receiving surfaces 201, so the optical filter 400 above the optical signal receiving surfaces 201 may be located on the photosensitive path of the photosensitive chip 200, which may ensure the performance of the photosensitive chip 200.

It should be noted that, in one embodiment, only one photosensitive unit 250 may be illustrated. In other embodiments, the number of the photosensitive units may be plural when the formed lens module may be applied to a dual-camera or array module product.

In one embodiment, the top surface of the encapsulation layer 350 may expose the photosensitive chip 200, so the encapsulation layer 350 may expose the first chip soldering pads 220 of the photosensitive chip 200, which may reduce the formation difficulty of the redistribution layer structure 360.

For example, by appropriately setting the thickness of the encapsulation layer 350, the optical signal receiving surfaces 201 and the top surface of the encapsulation layer 350 may have same height.

In one embodiment, the photosensitive chip 200 may be assembled in the through hole 355, where the rupture of the optical filter 400 during forming the encapsulation layer 350 may be avoided and the effect of forming the encapsulation layer 350 on the performance of the photosensitive chip 200 may also be avoided, which may ensure the performance of the lens module.

In one embodiment, the cross-sectional shape of the photosensitive chip 200 is the first rectangle and the cross-sectional shape of the through hole 355 is the second rectangle. The side dimension of the second rectangle may be greater than the side dimension of the first rectangle, so there may be a gap 351 (shown in FIG. 7) between the sidewalls of the through hole 355 and the photosensitive chip 200, which may reduce the probability of the photosensitive chip 200 to be damaged during the assembly process.

The image capturing assembly 260 may further include the adhesive 420 in the gap 351.

The adhesive 420 may be used to realize a physical connection between the photosensitive chip 200 and the encapsulation layer 350, so the photosensitive chip 200 may be fixed in the encapsulation layer 350.

In one embodiment, the material of the adhesive 420 may be an epoxy adhesive and the material of the encapsulation layer 350 may be an epoxy resin. The compatibility of the adhesive 420 and the encapsulation layer 350 may be improved by selecting an epoxy adhesive matching the material of the encapsulation layer 350.

The functional components may be specific functional components other than the photosensitive chip 200 in the imaging capturing assembly. The functional components may include at least one of the peripheral chip 230 and the passive component 240.

In one embodiment, the functional components may include the peripheral chip 230 and the passive component 240.

The peripheral chip 230 may be an active component and may be used to provide the photosensitive chip 200 with a peripheral circuit such as an analog power supply circuit, a digital power supply circuit, a voltage buffer circuit, a shutter circuit, a shutter drive circuit, etc.

In one embodiment, the peripheral chip 230 may include one or two of a digital signal processor chip and a memory chip. In other embodiments, the peripheral chip may also include chips with other functional types. For convenience of illustration, only one peripheral chip 230 may be shown in FIG. 13, but the number of the peripheral chips 230 may be not limited to one.

The peripheral chip 230 may usually be a silicon-based chip. The soldering pad of the peripheral chip 230 may be used for the electrical connection between the peripheral chip 230 and other chips or parts. In one embodiment, the peripheral chip 230 may include the second chip soldering pad 235.

In one embodiment, the second chip soldering pad 235 may face the optical filter 400, so the second chip soldering pad 235 and the first chip soldering pads 220 may be located on the same side of the encapsulation layer 350, so it will be convenient to implement the electrical connection between the peripheral chip 230 and the photosensitive chip 200. Correspondingly, the second chip soldering pad 235 may face away from the bottom surface of the encapsulation layer 350.

For example, the top surface of the encapsulation layer 350 may expose the second chip soldering pad 235, which may reduce the forming difficulty of the redistribution layer structure 360.

The passive component 240 may be used to play a specific role in the photosensitive operation of the photosensitive chip 200. The passive component 240 may include smaller electronic components such as resistors, capacitors, inductors, diodes, triodes, potentiometers, relays or drivers. For convenience of illustration, only one passive component 240 may be shown in FIG. 13, but the number of the passive components 240 may be not limited to one.

The soldering pad of the passive component 240 may be used for the electrical connection between the passive component 240 and other chips or parts. In one embodiment, the soldering pad of the passive component 240 may be the electrode 245.

It can be seen form the above-mentioned analysis that, when the first chip soldering pads 220 face the optical filter 400, the electrode 245 may face the optical filter 400, which may facilitate the electrical connection between the passive component 240 and the photosensitive chip 200. Correspondingly, the electrode 245 may also face away from the bottom surface of the encapsulation layer 350.

It should be noted that, the photosensitive chip 200 and the soldering pads of the functional components may all face away from the bottom surface of the encapsulation layer 350. In order to reduce the process difficulty of the electrical connection process, the functional component and the photosensitive chip 200 may have same thickness or relatively small difference in thickness, where the thickness of the functional component may be adjusted according to the thickness of the photosensitive chip 200. In one embodiment, the thickness difference between the functional component and the photosensitive chip 200 may be about −2 micrometers or about 2 micrometers.

The redistribution layer structure 360 may be used to implement electrical integration of the image capturing assembly 260. By selecting the redistribution layer structure 360, the distance between the photosensitive chip 200 and the functional components may be reduced, and the performance of the lens module may be improved (for example: the image capturing speed and storage speed may be improved). In addition, the feasibility and packaging efficiency may be improved by the redistribution layer structure 360.

In one embodiment, the first chip soldering pads 220, the second chip soldering pad 235 and the electrode 245 may be electrically connected by the redistribution layer structure 360.

In one embodiment, the redistribution layer structure 360 may be located on the top side of the encapsulation layer 350. Correspondingly, after the lens assembly is subsequently assembled to the formed image capturing assembly 260, the redistribution layer structure 360 may be in the holder of the lens assembly, which may improve the reliability of the image capturing assembly 260.

For example, the redistribution layer structure 360 may include: the conductive bumps 365 which are respectively on the soldering pads of the photosensitive chip 200 and the soldering pads of the functional components; and the interconnect lines 361 on the conductive bumps 365.

The conductive bumps 365 may protrude from the surfaces of the first chip soldering pads 220, the second chip soldering pad 235 and the electrode 245, and the conductive bumps 365 may improve the electrical connection reliability between the interconnect lines 361 and the soldering pads.

In one embodiment, the conductive bumps 365 may be formed by the soldering ball process. By selecting the soldering ball process, it may be advantageous to improve the reliability of signal transmission between each of chips and components and the interconnect lines 361. For example, the material of the conductive bumps 365 may be made of tin. In other embodiments, the conductive bumps may be formed by the electroplating process and the conductive bumps may be selected from the same material as the interconnect line.

In one embodiment, the material of the interconnect lines 361 may be made of copper. The copper has low resistivity, which may improve the conductive performance of the interconnect lines 361. In other embodiments, the material of the interconnect line may be made of other suitable conductive materials.

In one embodiment, the image capturing assembly 260 may further include: FPC board 510, which may be located on the redistribution layer structure 360.

The FPC board 510 may be used to implement the electrical connection between the image capturing assembly 260 and the lens assembly, and the electrical connection between the lens module and other components without using a circuit board. In addition, the lens module may be also electrically connected to other components in the electronic device through the FPC board 510, which may implement normal image capturing function of the electronic device.

For example, the FPC board 510 may have a circuit structure to achieve the electrical connection between the FPC board 510 and the redistribution layer structure 360.

It should be noted that, the FPC board 510 may be provided with a connector 520. When the lens module is applied to an electronic device, the connector 520 may be electrically connected to the mother board of the electronic device, so the information transmission between the lens module and other components in the electronic device may be achieved and image information of the lens module may be transmitted to the electronic device. For example, the connector 520 may be a gold finger connector.

In one embodiment, the image capturing assembly may be formed using the packaging method described in the above-mentioned embodiments and may also be formed using other packaging methods. The detailed description of the image capturing assembly may refer to the corresponding description in the above-mentioned embodiments, and details may not be described herein.

Figure 19:
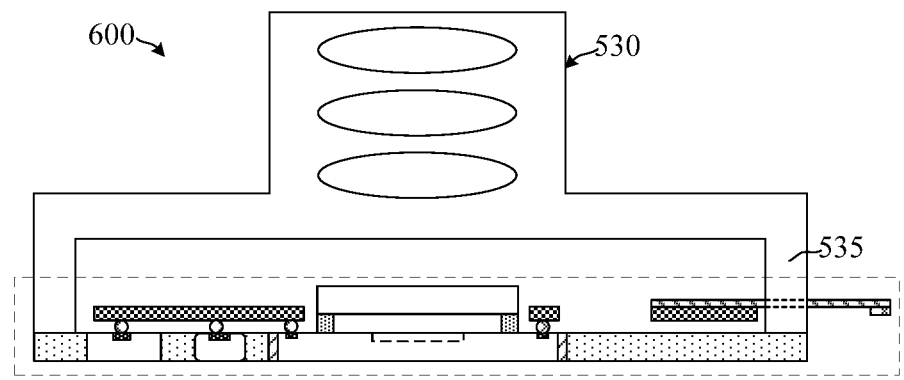
FIG. 19 illustrates a structural schematic corresponding to an exemplary lens module of the present disclosure.

Correspondingly, the present disclosure may further provide a lens module. FIG. 19 illustrates a structural schematic of an exemplary lens module of the present disclosure.

The lens module 600 may include: an image capturing assembly according to embodiments of the present disclosure (shown by the dotted circle in FIG. 19); and a lens assembly 530 including a holder 535, where the holder 535 may be mounted on the top surface of the encapsulation layer (not labeled) and may surround the photosensitive unit (not labeled) and the functional components (not labeled), and the lens assembly 530 may electrically connect the photosensitive chip (not labeled) with the functional components.

The lens assembly 530 may include a holder 535, a motor (not shown) mounted on the holder 535, and a lens group (not labeled) mounted on the motor. By using the holder 535, the installation of the lens assembly 530 may be implemented and the lens group may be on the photosensitive path of the photosensitive unit.

In one embodiment, the thickness of the image capturing assembly may be relatively small, and the thickness of the lens assembly 530 may be reduced by the encapsulation layer, so the total thickness of the lens module 600 may be reduced.

In addition, the photosensitive unit and the functional components may be all disposed inside the holder 535. Compared with the method of mounting the functional components on the peripheral motherboard, the present disclosure may reduce a distance between a photosensitive chip and functional components, correspondingly reduce the size of the lens module 600 and shorten the distance of the electrical connection, so it may further improve the rate of signal transmission and the performance of the lens module 600 (e.g., improve image capturing speed and storage speed).

Further, the photosensitive unit and the functional components may be integrated in the encapsulation layer, and the photosensitive unit, the functional components and the redistribution layer structure may be disposed inside the holder 535. In such way, the photosensitive unit, the functional components and the redistribution layer structure may be protected, which may improve the reliability and stability of the lens module 600 and ensure the imaging quality of the lens module 600.

In one embodiment, the holder 535 may be mounted on the top surface of the encapsulation layer and the lens assembly 530 may be electrically connected to the FPC board (not labeled). Specifically, the motor in the lens assembly 530 may be electrically connected to the FPC board.

It should be noted that, a detailed description of the image capturing assembly in one embodiment may refer to the corresponding description of the above-mentioned embodiments, and details may not be described herein.

Figure 20:
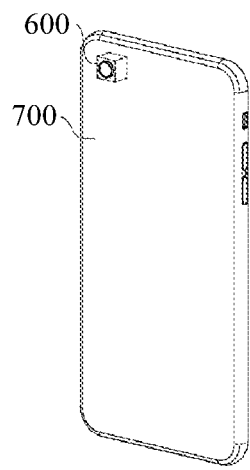
FIG. 20 illustrates a structural schematic corresponding to an exemplary electronic device of the present disclosure.

Correspondingly, the present disclosure may also provide an electronic device. FIG. 20 illustrates a structural schematic of an exemplary electronic device of the present disclosure.

In one embodiment, an electronic device 700 may include the lens module 600 according to the embodiments of the present disclosure.

The reliability and performance of the lens module 600 may be relatively high, and the image capturing quality, image capturing speed and storage speed of the electronic device 700 may be improved correspondingly. In addition, the total thickness of the lens module 600 may be relatively small, which may be advantageous to improve user experience.

For example, the electronic device 700 may be various image capturing devices such as a mobile phone, a tablet computer, a camera or a video camera.

As disclosed, the technical solutions of the present disclosure have the following advantages.

The present disclosure provides a method including: integrating photosensitive chips and functional components into an encapsulation layer and electrical connections through a redistribution layer structure, where, compared with the method of mounting the peripheral chip on the peripheral motherboard, the present disclosure may reduce a distance between a photosensitive chip and a functional component and reduce a distance of an electrical connection between a photosensitive chip and a functional component correspondingly, and further improve the rate of signal transmission and the performance of the lens modules (e.g., improve image capturing speed and storage speed); moreover, assembling photosensitive chips in through holes in the encapsulation layer after the photosensitive chips are formed the encapsulation layer, which may avoid cracking of optical filters during the formation of the encapsulation layer and may also avoid affecting the performance of the photosensitive chips by the formation process of the encapsulation layer, which may be advantageous to ensure the performance of the lens modules; and omitting the circuit boards (e.g., PCB) through the encapsulation layer and the redistribution layer structure, which may reduce the total thickness of the lens module and meet the requirements of miniaturization and ultra-thin thickness of the lens modules.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. An image capturing assembly, comprising:
    an encapsulation layer, embedded with functional components, wherein the encapsulation layer includes opposing top and bottom surfaces; the top surface and bottom surface of the encapsulation layer expose the functional components; a through hole is formed in the encapsulation layer; and the functional components have soldering pads facing away from a bottom of the encapsulation layer;
    a photosensitive unit including a photosensitive chip and an optical filter mounted on the photosensitive chip, wherein the photosensitive chip is embedded in the through hole; the top surface and bottom surface of the encapsulation layer expose the photosensitive chip; and the photosensitive chip includes soldering pads facing away from the bottom of the encapsulation layer; and
    a redistribution layer structure, which electrically connects the soldering pads of the photosensitive chip with the soldering pads of the functional components, wherein the redistribution layer structure and the optical filter are outside of the encapsulation layer and both above a top surface of the encapsulation layer.

2. The assembly according to claim 1, wherein:
the redistribution layer structure includes:
    conductive bumps, which are on the soldering pads of the photosensitive chip and the soldering pads of the functional components respectively; and
    the interconnect lines, which are on the conductive bumps.

3. The assembly according to claim 1, wherein:
an adhesive is disposed between the photosensitive chip and the encapsulate layer, wherein the adhesive has a top surface and a bottom surface coplanar with the top surface and bottom surface of the encapsulation layer, respectively.

4. The assembly according to claim 3, wherein:
a cross-section shape of the photosensitive chip is a first rectangle and a cross-section shape of the through hole is a second rectangle; and
a side dimension difference between the first rectangle and the second rectangle is larger than 0 and less than or equals to about 20 micrometers.

5. The assembly according to claim 1, wherein:
the functional components include at least one of peripheral chips and passive components, and
the top surface and bottom surface of the encapsulation layer are coplanar with a top surface and a bottom surface of each of the functional components, respectively.

6. The assembly according to claim 5, wherein:
the peripheral chips include one or two of digital signal processor chips and memory chips.

* * * * *